United States Patent
Jones (10) Patent No.: US 8,315,576 B2
(45) Date of Patent: Nov. 20, 2012

(54) CAPACITIVE COMPENSATION OF CASCADED DIRECTIONAL COUPLERS

(75) Inventor: David E. Jones, Ceder Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 226 days.

(21) Appl. No.: 12/773,292

(22) Filed: May 4, 2010

(65) Prior Publication Data

US 2011/0063044 A1    Mar. 17, 2011

Related U.S. Application Data

(60) Provisional application No. 61/175,641, filed on May 5, 2009, provisional application No. 61/249,170, filed on Oct. 6, 2009.

(51) Int. Cl.
*H04B 1/44* (2006.01)

(52) U.S. Cl. .......... 455/78; 455/319; 455/325; 333/109; 333/116

(58) Field of Classification Search ............ 455/78, 455/319, 325, 333; 333/109, 116, 128, 130, 333/131
See application file for complete search history.

(56) References Cited

U.S. PATENT DOCUMENTS

| | | | |
|---|---|---|---|
| 5,841,319 A | 11/1998 | Sato | |
| 7,148,749 B2 | 12/2006 | Rahman et al. | |
| 7,187,910 B2 * | 3/2007 | Kim et al. | 455/115.3 |
| 7,787,570 B2 | 8/2010 | Rozenblit et al. | |
| 2007/0069820 A1 * | 3/2007 | Hayata et al. | 330/298 |
| 2009/0264091 A1 | 10/2009 | Jensen et al. | |
| 2010/0027596 A1 | 2/2010 | Bellaouar et al. | |

OTHER PUBLICATIONS

Unknown Author, "SKY77344-21 Power Amplifier Module—Evaluation Information," Skyworks, Version-21 Feb. 16, 2010, 21 pages.
Non-final Office Action for U.S. Appl. No. 12/774,155 mailed Jun. 21, 2012, 18 pages.

* cited by examiner

*Primary Examiner* — Tuan H Nguyen
(74) *Attorney, Agent, or Firm* — Withrow & Terranova, P.L.L.C.

(57) ABSTRACT

A cascaded directional couplers circuit having capacitive compensation such that the directivity of a resistively terminated one of the cascaded couplers is not degraded by an inductance of the other one of the cascaded directional couplers.

20 Claims, 5 Drawing Sheets

CAPACITIVE COMPENSATION OF CASCADED DIRECTIONAL COUPLERS

RELATED APPLICATIONS

This application claims the benefit of provisional patent application Ser. No. 61/175,641, filed May 5, 2009, the disclosure of which is hereby incorporated herein by reference in its entirety. This application also claims the benefit of provisional patent application Ser. No. 61/249,170, filed Oct. 6, 2009, the disclosure of which is hereby incorporated herein by reference in its entirety. This application further relates to U.S. Pat. No. 6,701,138, entitled "Power Amplifier Control," filed Jun. 11, 2001, which is hereby incorporated herein by reference in its entirety.

FIELD OF THE DISCLOSURE

The present disclosure relates to cascaded directional couplers, and particularly to a capacitive compensation of the cascaded directional couplers.

BACKGROUND

In recent years, worldwide demand for wireless cellular communications has increased dramatically. Radiotelephones manufactured to meet this burgeoning demand must adhere to standards such as the Global System for Mobile Communications (GSM) standard. Another standard, the Digital Cellular System (DCS) standard, is based on GSM, but is directed towards higher cell density and lower power. A third standard, Personal Communications Services (PCS) is a "catch all" for many digital cellular systems, including GSM, operating in North America. These standards all require precise output power control over a large dynamic range in order to prevent a transmitter located in one cell from interfering with the reception of transmissions from other transmitters in neighboring cells.

A key component common to all radiotelephones is a radio frequency (RF) power amplifier (PA). In modern digital radiotelephones, power amplifiers receive as input a frequency or phase-modulated RF carrier. The radio frequency carrier is what "carries" digital information such as digitized voice or data to a cellular base station. Before reaching the power amplifiers, the RF carrier is too weak to be received by a cellular base station. Therefore, it is the function of the power amplifiers to boost the power of the RF carrier to a level sufficient for reception by a cellular base station.

Some mobile terminals, such as modern digital radiotelephones, also include a cascaded directional couplers circuit. The cascaded directional couplers circuit comprising a first directional coupler connected in series with a second directional coupler is usable to provide a feedback of a portion of the power amplifiers' outputs in order to accurately control the output power of the power amplifiers.

A typical cascaded couplers circuit is well suited for light coupling applications having a coupling that is greater than 30 decibels (dB). However, as coupling increases, the first directional coupler that is typically close to a load such as an antenna appears to be significantly more inductive to an isolated port of the second directional coupler that is connected in series with a coupled port of the first directional coupler via a conductive path such as a metal trace. Consequently, a problem arises in that in applications that require heavy coupling that is less than 22 dB, the directivity of the second directional coupler is degraded.

Thus, there remains a need to provide a type of compensation that will eliminate the degradation of the directivity when heavy coupling is implemented with the cascaded directional couplers circuit.

SUMMARY OF THE DISCLOSURE

The present disclosure provides for a capacitive compensation of a cascaded directional couplers circuit having a first directional coupler connected in series with a second directional coupler. For example, an embodiment of the present disclosure eliminates the degradation of the directivity for the second directional coupler, which farthest from a load, by adding a compensating capacitor between a coupled port of the first directional coupler and an isolated port of the second directional coupler. The capacitance value of the compensating capacitor is selected to cancel an inductive reactance of the first directional coupler.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice embodiments of the disclosure and illustrate the best mode of practicing the principles of the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
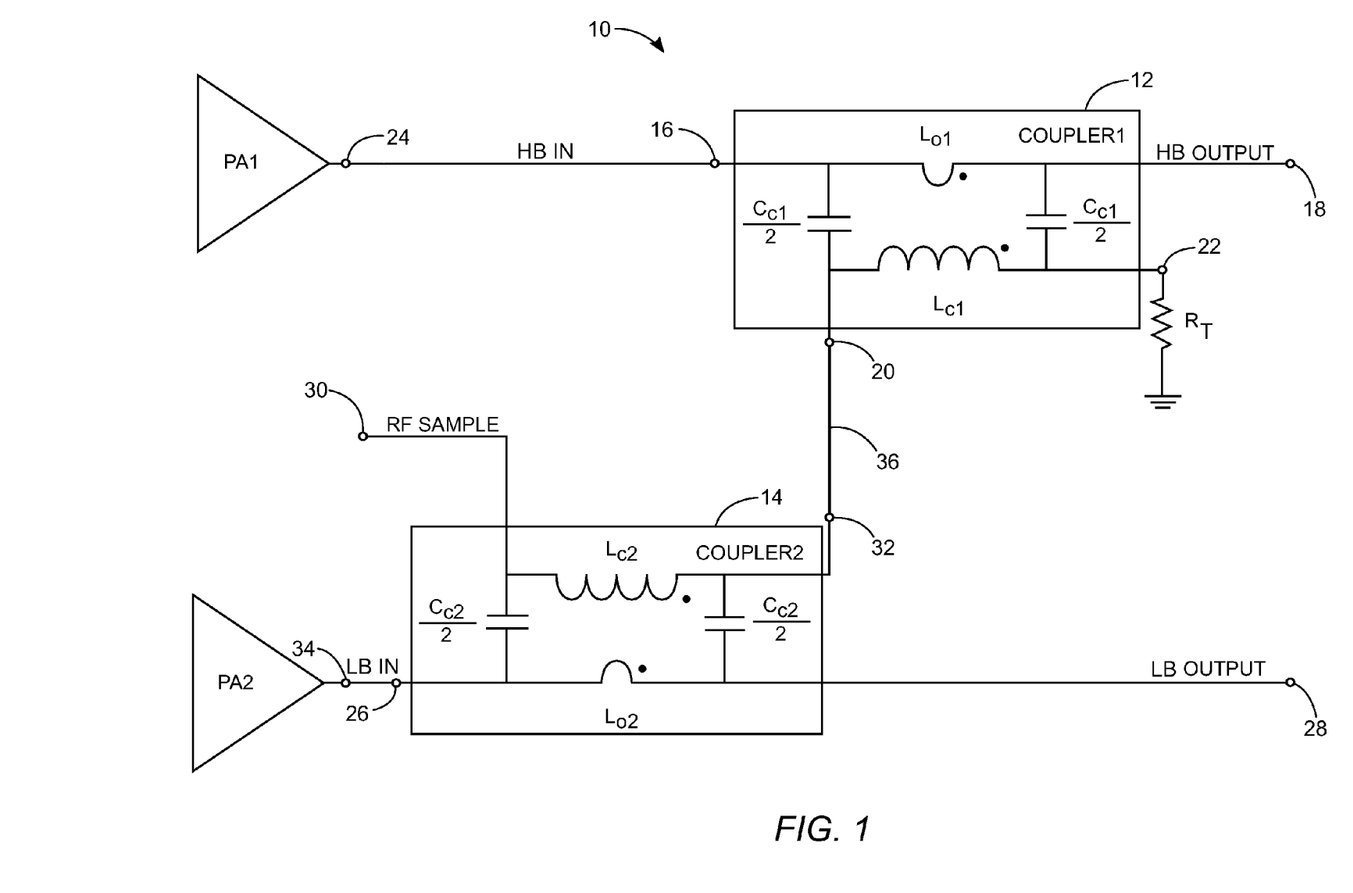
FIG. 1 is a schematic of a cascaded directional couplers circuit that has degraded directivity when heavy coupling is implemented.

FIG. 1 is a schematic of a cascaded directional couplers circuit 10 that includes a first directional coupler 12 connected in series with a second directional coupler 14. The first directional coupler 12 has an input port 16 that is electrically connected to an output port 18 through a first coupling element that is an inductor $L_{O1}$. The first directional coupler 12 also includes a coupled port 20 that is electrically connected to an isolated port 22 through a second coupling element that is an inductor $L_{C1}$. The isolated port 22 is typically terminated with a resistive termination element such as a resistor $R_T$. The inductor $L_{O1}$ passes a first RF signal from a first power amplifier PA1 having an output terminal 24 that is electrically connected to the input port 16. The first RF signal has a frequency of a first frequency band. An exemplary first frequency band is a high-band (HB) such as 1710-1980 MHz.

The second directional coupler 14 has an input port 26 that is electrically connected to an output port 28 through a first coupling element that is an inductor $L_{O2}$. The second directional coupler 14 also includes a coupled port 30 that is electrically connected to an isolated port 32 through a second coupling element that is an inductor $L_{C2}$. The inductor $L_{O2}$ passes a second RF signal from a second power amplifier PA2 having an output terminal 34 that is electrically connected to the input port 26. The second RF signal has a frequency of a second frequency band. An exemplary second frequency band is a low-band (LB) such as 824-915 MHz. The coupled port 30 provides a signal labeled RF SAMPLE that is useable to provide feedback for controlling the output power of the first power amplifier PA1 and the second power amplifier PA2.

Miniaturization of the cascaded directional couplers circuit 10 is realized by conductively connecting the coupled port 20 of the first directional coupler 12 to the isolated port 32 of the second directional coupler 14 via a conductive path 36 such as a metal trace.

While FIG. 1 depicts the cascaded directional couplers circuit 10 as having lumped elements such as the capacitors $C_{C1}$ and $C_{C2}$, in practice the couplers are distributed. For example, the capacitors $C_{C1}$ and $C_{C2}$ exist due to the overlaps of winding segments making up the inductors $L_{C1}$ and $L_{O1}$, and the inductors $L_{C2}$ and $L_{O2}$, respectively. The lumped element representation of the cascaded directional couplers circuit 10 is presented for the purpose of simplification.

A miniaturization of the first directional coupler 12 is further realized by placing an inductor $L_{C1}$ adjacent to an output path trace represented by lumped output inductance $L_{O1}$. An electromagnetic coupling is achieved by a mutual inductance and capacitance between the inductor $L_{C1}$ and the output inductor $L_{O1}$. Further, the directivity of the first directional coupler 12 is achieved by adjusting the electric and magnetic coupling between the inductor $L_{C1}$ and the output inductor $L_{O1}$ in order to cancel a pickup of a reflected wave. Likewise, a miniaturization of the second directional coupler 14 is realized by placing an inductor $L_{C2}$ adjacent to an output path trace having a lumped output inductance represented by the inductor $L_{O2}$. Similar to the electromagnetic coupling found in the first directional coupler 12, an electromagnetic coupling is achieved by a mutual inductance and capacitance between the inductor $L_{C2}$ and the output inductor $L_{O2}$ in the second directional coupler 14. Moreover, the directivity of the second directional coupler 14 is achieved by adjusting the electric and magnetic coupling between the inductor $L_{C2}$ and the output inductance $L_{O2}$ in order to cancel a pickup of a reflected wave.

The cascaded directional couplers circuit 10 shown in FIG. 1 will exhibit a degraded directivity for the second directional coupler 14 due to the inductor $L_{C1}$ of the first directional coupler 12. A load impedance (Zload2) for the second directional coupler 14 is given by the following equation:

$$Zload2 \sim j\omega L_{C1} + R_T$$

Figure 2:
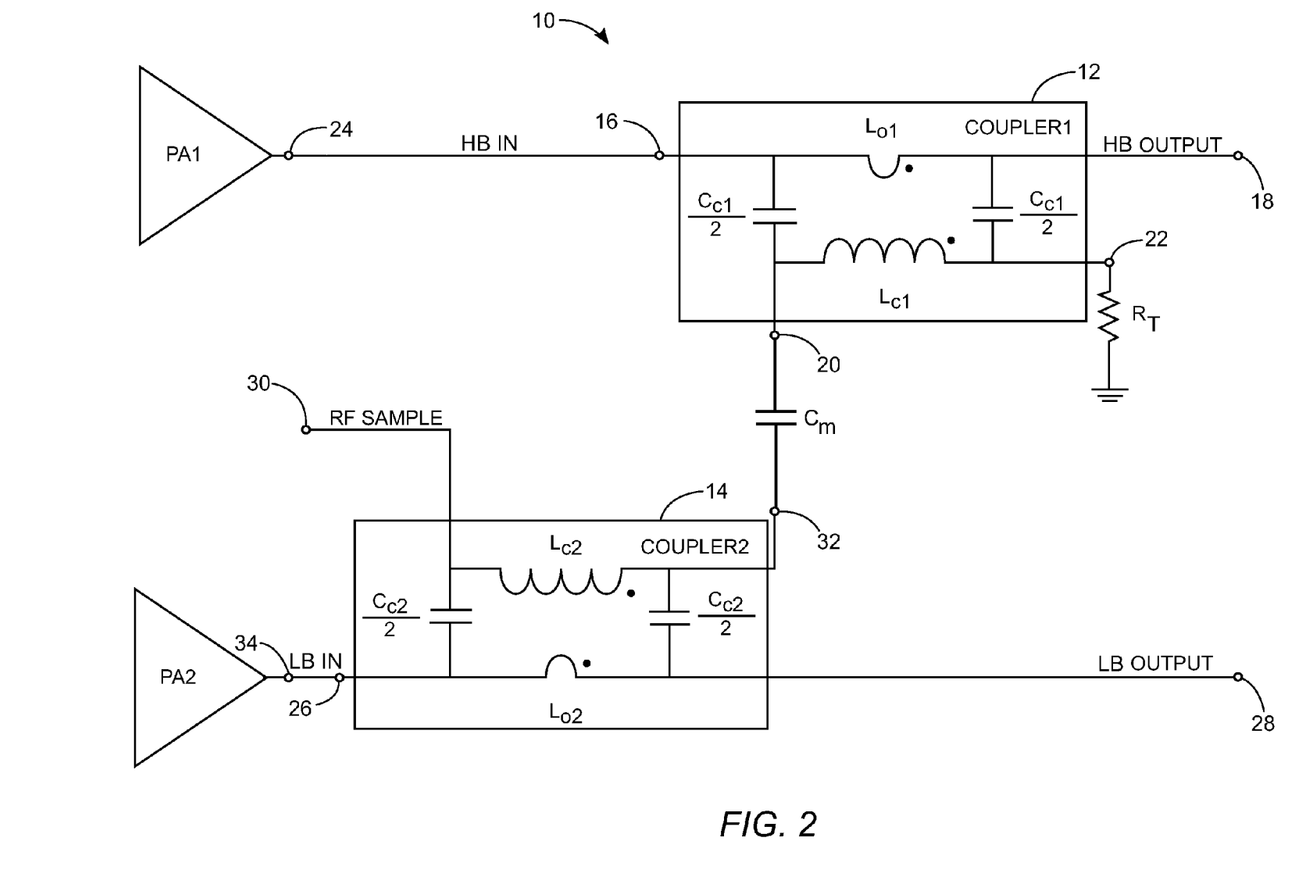
FIG. 2 depicts a capacitive compensation that is in accordance with the present disclosure for the cascaded directional couplers circuit depicted in FIG. 1.

FIG. 2 depicts an embodiment of the cascaded directional couplers circuit 10 according to the present disclosure. This particular embodiment of the cascaded directional couplers circuit 10 eliminates the degradation of the directivity for the second directional coupler 14 by replacing the conductive path 36 with a compensating capacitor Cm. In this way, instead of being conductively connected, the first directional coupler 12 is capacitively connected to the second directional coupler 14 through the compensating capacitor Cm being connected between the coupled port 20 of the first directional coupler 12 and the isolated port 32 of the second directional coupler 14.

The capacitance value of the compensating capacitor Cm is selected to cancel an inductive reactance due to the inductor $L_{C1}$ and the inductor $L_{O1}$ of the first directional coupler 12. In this way, the load (Zload2) experienced by the second directional coupler 14 is given by the following equation:

$$Zload2 \sim R_T$$

Through the use of circuit simulation software or direct circuit analysis, an optimal value of capacitance for the capacitor $C_m$ is determined such that a series resonance between the capacitor $C_m$ and the inductor $L_{C1}$ will occur at the HB and LB frequencies of operation for the cascaded directional couplers circuit 10. In this way, the second directional coupler 14 is effectively loaded by the resistor $R_T$ that terminates the first directional coupler 12.

In accordance with this disclosure, simulation and experimental results have shown that a capacitance value of 10.5 pF for the compensation capacitor $C_m$ will provide an LB directivity that exceeds 27 dB. In contrast, a directivity of only 16 db is available when the compensation capacitor is replaced with a conductive short between the coupled port 20 of the first directional coupler 12 and the isolated port 32 of the second directional coupler 14. Moreover, the cascaded directional couplers circuit 10 in accordance with the present disclosure provides a coupling of approximately 17 dB for RF signals outputted from either the power amplifier PA1 or the power amplifier PA2.

Figure 3:
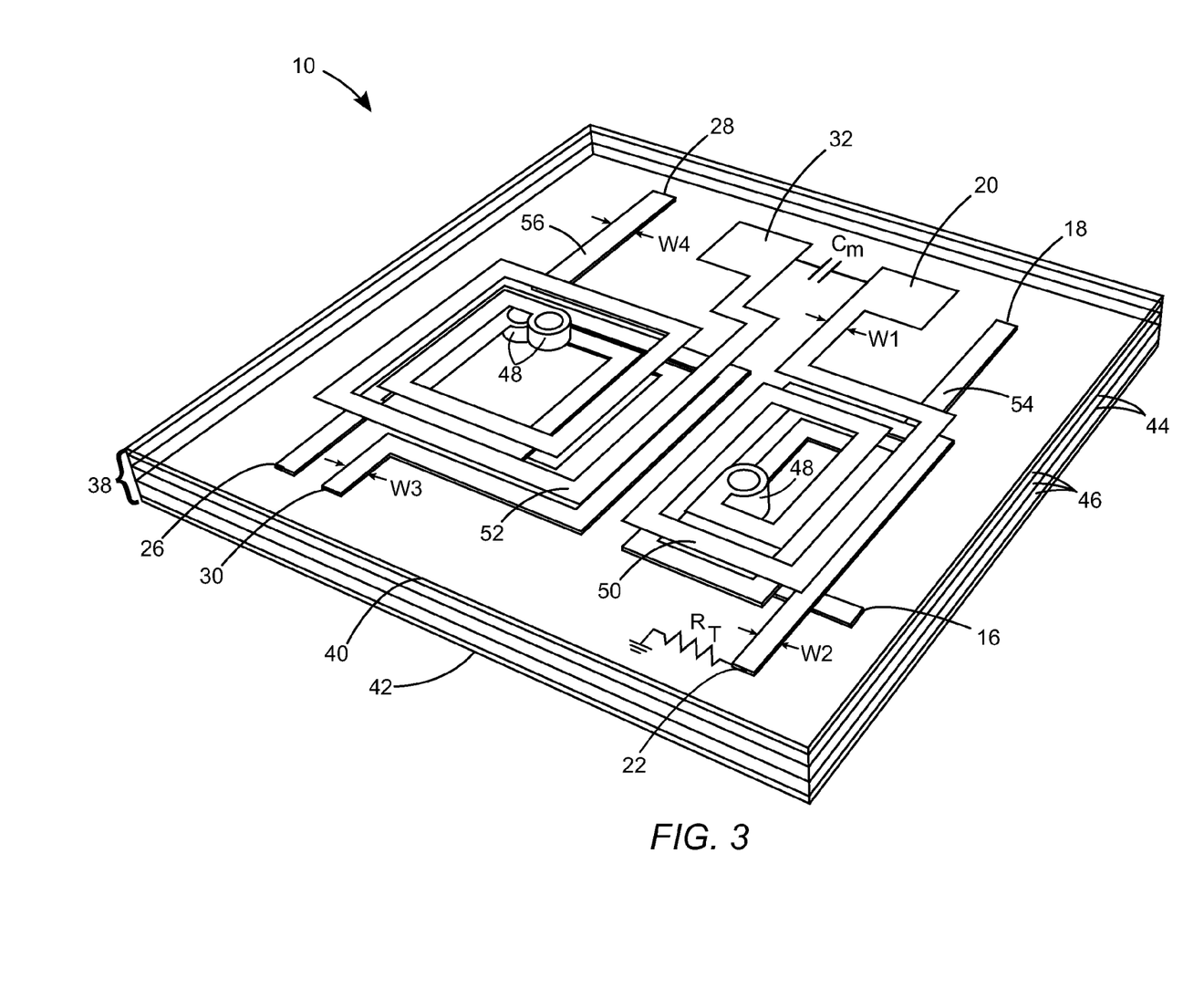
FIG. 3 depicts the cascaded directional couplers circuit of the present disclosure integrated into a substrate that is multilayered.

FIG. 3 depicts an embodiment of the cascaded directional couplers circuit 10 according to the present disclosure that is integrated into a substrate 38 that is preferably a multilayered integrated circuit substrate. Preferably, the cascaded directional couplers circuit 10 is buried beneath a pseudomorphic high mobility transistor (pHEMT) mode switch die (not shown). The substrate 38 has a top layer ground plane 40, and a bottom layer ground plane 42. Consequently, the coupled inductors $L_{C1}$ and $L_{O1}$ and coupled inductors $L_{C2}$ and $L_{O2}$ are formed as stripline inductors as opposed to microstrip inductors. The top layer ground plane 40 is depicted as translucent in FIG. 3 only for the purpose of illustrating the cascaded directional couplers circuit 10 that is beneath the top layer ground plane 40. A plurality of metal layers 44 that are sandwiched between alternating dielectric layers 46 contain the coupled inductors $L_{C1}$ and $L_{O1}$ and coupled inductors $L_{C2}$ and $L_{O2}$. A plurality of vias 48 is usable to electrically connect desired portions of the metal layers 44 together.

The inductor $L_{O1}$ and the inductor $L_{O2}$ are known as through path inductors and are positioned in the substrate 38 to have a minimum loss while still providing enough inductance to achieve a desired coupling value. Inductance values for the inductor $L_{C1}$ and the inductor $L_{C2}$ for a desired coupling value are determined through the use of circuit simulation software and/or direct circuit analysis. The inductance values are then used to determine a set of mechanical dimensions and number of winding turns for a primary winding 50 that makes up the inductor $L_{C1}$ and a primary winding 52 that makes up the inductor $L_{C2}$. A set of mechanical dimensions and number of turns for a secondary winding 54 that makes up the inductor $L_{O1}$ and a secondary winding 56 that makes up the inductor $L_{O2}$ may be determined in similar fashion.

Combining the inductor $L_{O1}$ with the inductor $L_{C1}$ and the inductor $L_{O2}$ with the inductor $L_{C2}$ results in both magnetic and capacitive couplings. A mutual inductance between the inductor $L_{O1}$ and the inductor $L_{C1}$ is due to a common magnetic flux between the primary winding 50 of $L_{C1}$ and the secondary winding 54 of inductor $L_{O1}$. Likewise, a mutual inductance between the inductor $L_{O2}$ and the inductor $L_{C2}$ is due to a common magnetic flux between the primary winding 52 of $L_{C2}$ and the secondary winding 56 of inductor $L_{O2}$.

The capacitor $C_{C1}$ resulting from a capacitive coupling between the primary winding 50 of inductor $L_{C1}$ and the secondary winding 54 of inductor $L_{O1}$ is due to an overlapping of winding segments that are formed in the metal layers 44. A portion of the capacitive coupling experienced by the capacitor $C_{C1}$ may be adjusted during layout by varying a geometric dimension of the geometric dimensions of the primary winding 50 making up the inductor $L_{C1}$ and the secondary winding 54 making up the inductor $L_{O1}$. The preferred geometric dimension to be varied is width. For example, a winding width W1 for the inductor $L_{C1}$ and/or a winding width W2 for the inductor $L_{O1}$ may be varied to adjust the capacitive coupling $C_{C1}$. Another portion of the capacitive coupling experienced by the capacitor $C_{C1}$ may be adjusted during layout by adjusting the separation between overlapping portions of the primary winding 50 and the secondary winding 54.

The capacitor $C_{C2}$ results from a capacitive coupling between the primary winding 52 of $L_{C2}$ and the secondary winding 56 of inductor $L_{O2}$ is due to an overlapping of portions of the primary winding 52 and the secondary winding 56 that are formed in the metal layers 44. A fraction of the capacitive coupling experienced by $C_{C2}$ may be adjusted during layout of the substrate 38 by varying geometric dimensions of the primary winding 52 making up the inductor $L_{C2}$ and the secondary winding 56 making up the inductor $L_{O2}$. The preferred geometric dimension winding width. For example, a winding width W3 for inductor $L_{C2}$ and/or a winding width W4 for the inductor $L_{O2}$ may be varied to adjust the capacitive coupling $C_{C2}$. The capacitive coupling $C_{C2}$ may also be adjusted during layout of the substrate 38 by adjusting the separation between overlapping portions of the primary winding 52 and the secondary winding 56 making up the inductors $L_{C2}$ and $L_{O2}$, respectively.

One goal of varying the capacitive coupling $C_{C1}$ and the capacitive coupling $C_{C2}$ is to maximize directivity for the cascaded directional couplers circuit 10. An iterative electromagnetic (EM) simulation using EM simulation software is a preferred method for determining the mechanical dimensions for the primary winding 50, the secondary winding 54, the primary winding 52 and the secondary winding 56 making up the inductors $L_{C1}$, $L_{O1}$, $L_{C2}$, and $L_{O2}$, respectively.

Figure 4:
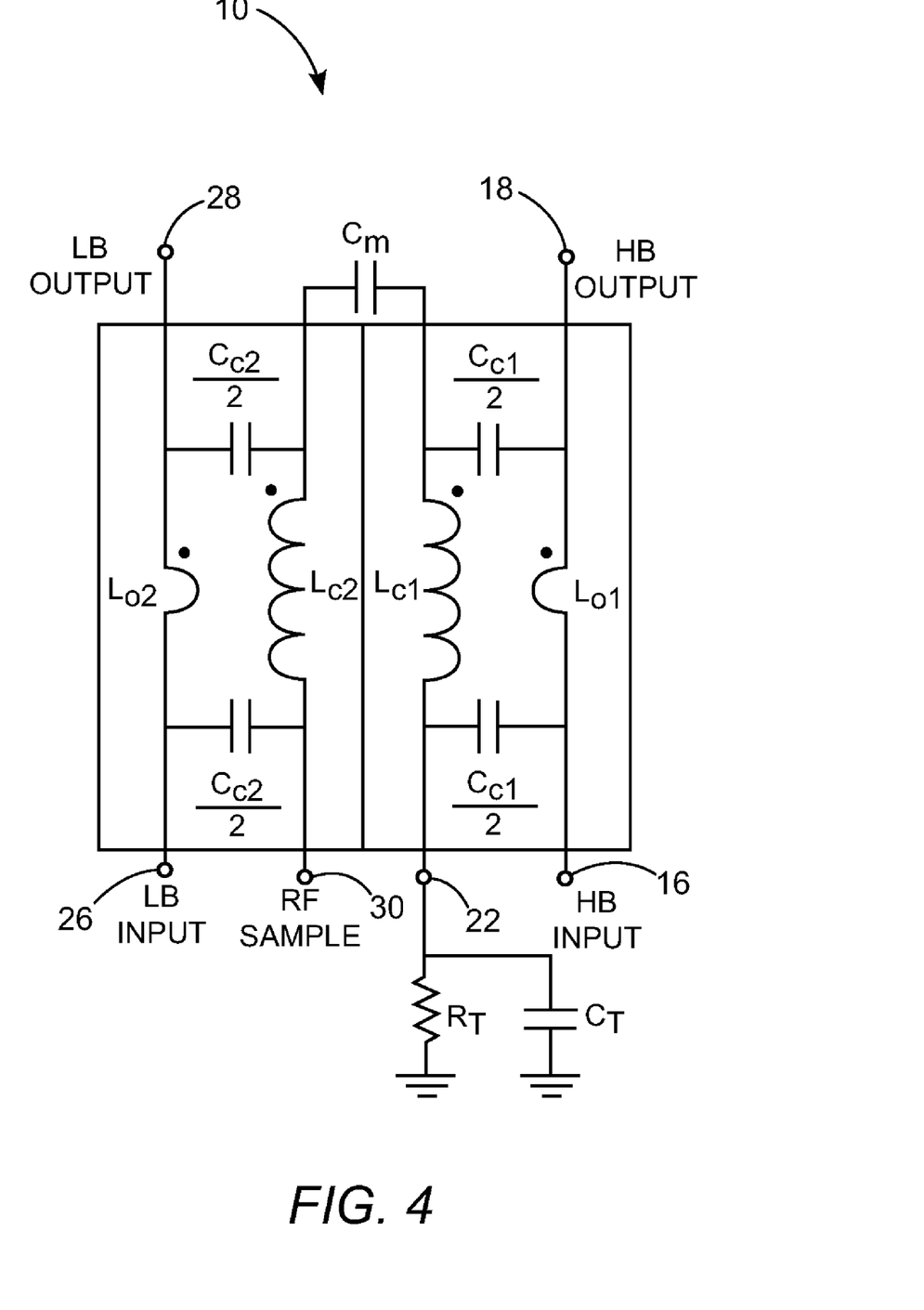
FIG. 4 depicts an equivalent circuit schematic for the cascaded directional couplers circuit of FIG. 3.

FIG. 4 depicts an equivalent circuit schematic for the cascaded directional couplers circuit 10 that is integrated into the substrate 38 of FIG. 3. In some instances, a purely resistive termination of the first directional coupler 12 is insufficient to maximize the directivity of the cascaded directional couplers circuit 10. In such instances, it is preferable to add a capacitor $C_T$ in parallel with the termination resistor $R_T$ in order to maximize the directivity of the cascaded directional couplers circuit 10.

Figure 5:
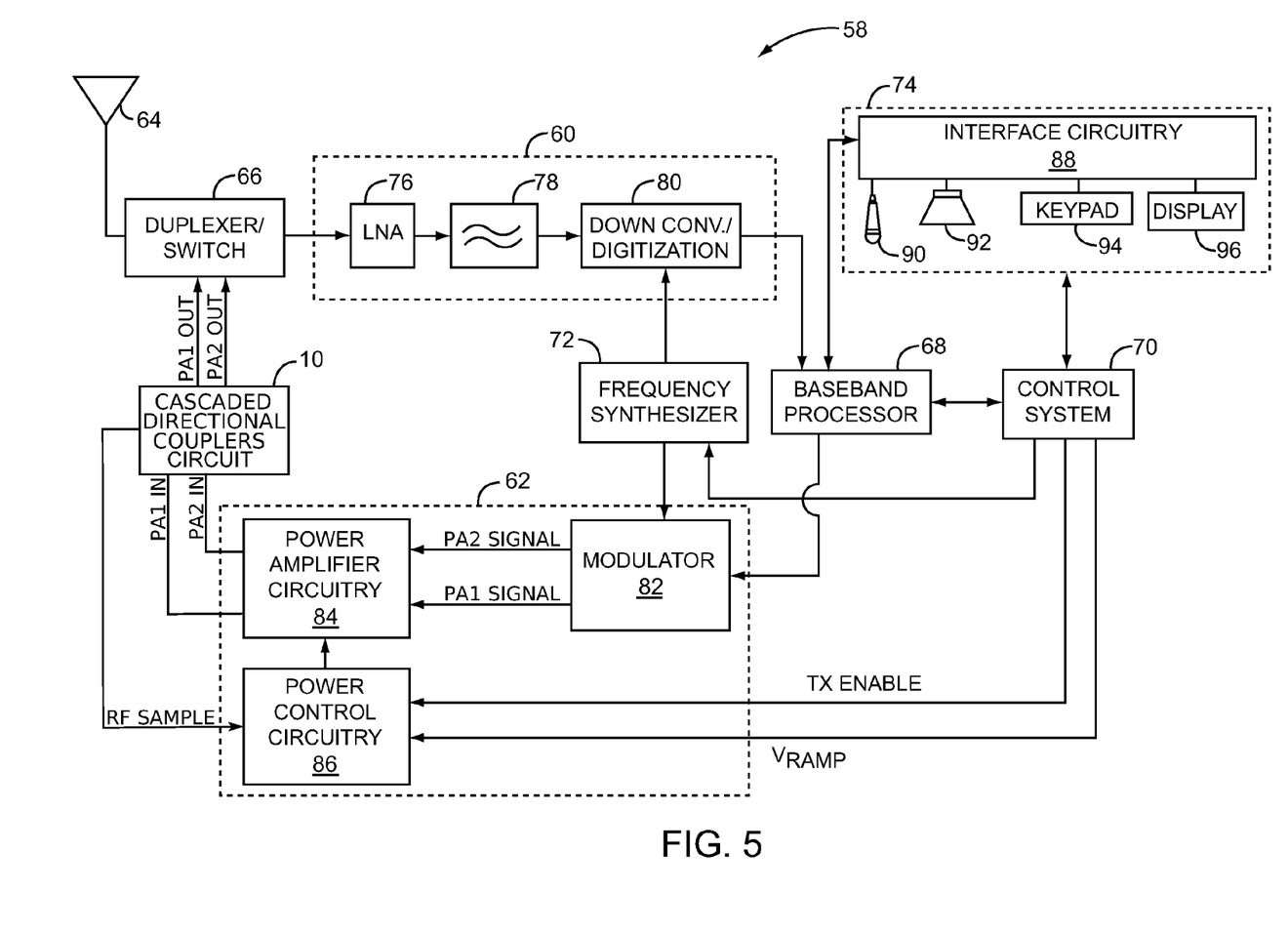
FIG. 5 illustrates a mobile terminal that includes a cascaded directional couplers circuit that is in accordance with an embodiment of the present disclosure.

With reference to FIG. 5, an embodiment of the present disclosure is preferably incorporated in a mobile terminal 58, such as a mobile telephone, personal digital assistant (PDA), or the like. The basic architecture of a mobile terminal 58 may include a receiver front end 60, a radio frequency (RF) transmitter section 62, an antenna 64, a duplexer or switch 66, a baseband processor 68, a control system 70, a frequency synthesizer 72, and an interface 74. The receiver front end 60 receives information bearing RF signals from one or more remote transmitters provided by a base station. A low noise amplifier (LNA) 76 amplifies the signal. A filter circuit 78 minimizes broadband interference in the received signal, while a downconverter 80 downconverts the filtered, received signal to an intermediate or baseband frequency signal, which is then digitized into one or more digital streams. The receiver front end 60 typically uses one or more mixing frequencies generated by the frequency synthesizer 72.

The baseband processor 68 processes the digitized received signal to extract the information or data bits conveyed in the received signal. This processing typically comprises demodulation, decoding, and error correction operations. As such, the baseband processor 68 is generally implemented in one or more digital signal processors (DSPs).

On the transmit side, the baseband processor 68 receives digitized data from the control system 70, which it encodes for transmission. The encoded data is output to the RF transmitter section 62, where it is used by a modulator 82 to modulate a carrier signal that is at a desired transmit frequency. A power amplifier circuitry 84 amplifies the modulated carrier signal to a level appropriate for transmission from the antenna 64.

As described in further detail below, the power amplifier circuitry 84 provides gain for the signal to be transmitted under control of a power control circuitry 86, which is preferably controlled by the control system 70 using a signal commonly referred to as $V_{RAMP}$. The cascaded directional couplers circuit 10 that is compensated by the capacitor Cm (FIG. 2, FIG. 3 and FIG. 4) provides a feedback signal (RF SAMPLE) to the power control circuitry 86. Preferably, the bias for the power amplifier circuitry 84 is relatively stable regardless of power, and varying the voltage supplied to the power amplifier circuitry 84 controls actual power levels. The control system 70 may also provide a transmit enable (TX ENABLE) signal to effectively turn the power amplifier circuitry 84 and power control circuitry 86 on during periods of transmission.

A user may interact with the mobile terminal 58 via the interface 74, which may include interface circuitry 88 associated with a microphone 90, a speaker 92, a keypad 94, and a display 96. The interface circuitry 88 typically includes analog-to-digital converters, digital-to-analog converters, amplifiers, and the like. Additionally, it may include a voice encoder/decoder, in which case it may communicate directly with the baseband processor 68.

The microphone 90 will typically convert audio input, such as the user's voice, into an electrical signal, which is then digitized and passed directly or indirectly to the baseband processor 68. Audio information encoded in the received signal is recovered by the baseband processor 68 and converted into an analog signal suitable for driving the speaker 92 by the input/output and interface circuitry 88. The keypad 94 and display 96 enable the user to interact with the mobile terminal 58, inputting numbers to be dialed, address book information, or the like, and monitoring call progress information.

Those skilled in the art will recognize improvements and modifications to the present disclosure. All such improvements and modifications are considered within the scope of the concepts disclosed herein.

What is claimed is:

1. A cascaded directional couplers circuit comprising:
   a first directional coupler having an input port electrically connected to an output port through a first coupling element and a coupled port connected to an isolated port through a second coupling element, the first coupling element to pass a first RF signal having a frequency of a first frequency band, the second coupling element to couple the first RF signal passed by the first coupling element; and a second directional coupler having an input port electrically connected to an output port through a first coupling element and a coupled port connected to an isolated port through a second coupling element, the first coupling element to pass a second RF signal having a frequency of a second frequency band, the second coupling element to couple the second RF signal passed by the first coupling element of the second directional coupler, the first directional coupler being capacitively connected to the second directional coupler through a capacitor connected between the coupled port of the first directional coupler and the isolated port of the second directional coupler.

2. The cascaded directional couplers circuit of claim 1 further including a resistive termination element coupled between the isolated port of the first directional coupler and a fixed voltage source.

3. The cascaded directional couplers circuit of claim 2 wherein the fixed voltage source is at a ground potential.

4. The cascaded directional couplers circuit of claim 1 wherein a capacitance value of the capacitor is sufficient to cancel an inductive reactance as seen from the isolated port of the second directional coupler, wherein the inductive reactance is due to the first coupling element and the second coupling element of the first directional coupler.

5. The cascaded directional couplers circuit of claim 1 wherein the first coupling element and the second coupling element of the first directional coupler, and the first coupling element and the second coupling element of the second directional coupler are inductors comprising stripline winding elements having geometric dimensions of length and width.

6. The cascaded directional couplers circuit of claim 5 wherein a capacitive reactance due to an overlapping of the stripline winding elements is adjustable in part during manufacture of the cascaded directional couplers circuit by varying the width of the stripline winding elements.

7. A mobile terminal for operating in multiple radio frequency (RF) frequency bands, the mobile terminal comprising:
   an antenna;
   a receiver coupled to the antenna; and
   a transmitter coupled to the antenna, the transmitter comprising:
      a first RF power amplifier for amplifying a first RF signal having a frequency of a first frequency band within which the mobile terminal transmits;
      a second RF power amplifier for amplifying a second RF signal having a frequency of a second frequency band within which the mobile terminal transmits;
      a cascaded directional couplers circuit with a first directional coupler having an input port electrically connected to an output port through a first coupling element and a coupled port connected to an isolated port through a second coupling element, the first coupling element to pass the first RF signal having a frequency of the first frequency band, the second coupling element to couple the first RF signal passed by the first coupling element, and
      a second directional coupler having an input port electrically connected to an output port through a first coupling element and a coupled port connected to an isolated port through a second coupling element, the first coupling element to pass the second RF signal having a frequency of the second frequency band, the second coupling element to couple the second RF signal passed by the first coupling element of the second directional coupler, the first directional coupler being capacitively connected to the second directional coupler through a capacitor connected between the coupled port of the first directional coupler and the isolated port of the second directional coupler.

8. The cascaded directional couplers circuit of claim 7 further including a resistive termination element coupled between the isolated port of the first directional coupler and a fixed voltage source.

9. The cascaded directional couplers circuit of claim 8 wherein the fixed voltage source is at a ground potential.

10. The cascaded directional couplers circuit of claim 7 wherein a capacitance value of the capacitor is sufficient to cancel an inductive reactance as seen from the isolated port of the second directional coupler, wherein the inductive reactance is due to the first coupling element and the second coupling element of the first directional coupler.

11. The cascaded directional couplers circuit of claim 7 wherein the first coupling element and the second coupling element of the first directional coupler, and the first coupling element and the second coupling element of the second directional coupler are inductors comprising stripline winding elements having geometric dimensions of length and width.

12. The cascaded directional couplers circuit of claim 11 wherein a capacitive reactance due to an overlapping of the stripline winding elements is adjustable in part during manufacture of the cascaded directional couplers circuit by varying the width of the stripline winding elements.

13. A cascaded directional couplers circuit comprising:
   an integrated circuit substrate;
   a first directional coupler integrated into the integrated circuit substrate, the first directional coupler having an input port electrically connected to an output port through a first coupling element and a coupled port connected to an isolated port through a second coupling element, the first coupling element to pass a first RF signal having a frequency of a first frequency band, the second coupling element to couple the first RF signal passed by the first coupling element; and
   a second directional coupler integrated into the integrated circuit substrate, the second directional coupler having an input port electrically connected to an output port through a first coupling element and a coupled port connected to an isolated port through a second coupling element, the first coupling element to pass a second RF signal having a frequency of a second frequency band, the second coupling element to couple the second RF signal passed by the first coupling element of the second directional coupler, the first directional coupler being capacitively connected to the second directional coupler through a capacitor connected between the coupled port of the first directional coupler and the isolated port of the second directional coupler.

14. The cascaded directional couplers circuit of claim 13 wherein the integrated circuit substrate is multilayered having alternating dielectric and metal layers.

15. The cascaded directional couplers circuit of claim 14 wherein one of the metal layers is a top layer ground plane and another one of the metal layers is a bottom layer ground plane.

16. The cascaded directional couplers circuit of claim 13 further including a resistive termination element coupled between the isolated port of the first directional coupler and a fixed voltage source.

17. The cascaded directional couplers circuit of claim 16 wherein the fixed voltage source is at a ground potential.

18. The cascaded directional couplers circuit of claim 13 wherein a capacitance value of the capacitor is sufficient to cancel an inductive reactance as seen from the isolated port of the second directional coupler, wherein the inductive reactance is due to the first coupling element and the second coupling element of the first directional coupler.

19. The cascaded directional couplers circuit of claim 13 wherein the first coupling element and the second coupling element of the first directional coupler, and the first coupling element and the second coupling element of the second directional coupler are inductors comprising stripline winding elements having geometric dimensions of length and width.

20. The cascaded directional couplers circuit of claim 19 wherein a capacitive reactance due to an overlapping of the stripline winding elements is adjustable in part during manufacture of the cascaded directional couplers circuit by varying the width of the stripline winding elements.

* * * * *